United States Patent [19]

Shirland et al.

[11] 4,191,794
[45] Mar. 4, 1980

[54] INTEGRATED SOLAR CELL ARRAY

[75] Inventors: Fred A. Shirland; William J. Biter, both of Murrysville, Pa.

[73] Assignee: Westinghouse Electric Corp., Pittsburgh, Pa.

[21] Appl. No.: 905,068

[22] Filed: May 11, 1978

[51] Int. Cl.² .................... B05D 5/12; H01L 31/06
[52] U.S. Cl. .................... 427/74; 136/89 MS; 29/572; 427/250
[58] Field of Search .......... 136/89 P, 89 CD, 89 TF, 136/89 MS; 29/572; 427/74

[56] References Cited

U.S. PATENT DOCUMENTS

| | | | |
|---|---|---|---|
| 3,546,542 | 12/1970 | Riel et al. | 317/234 |
| 4,038,104 | 7/1977 | Tsutomo | 136/89 P |
| 4,042,418 | 8/1977 | Biter | 136/89 P |

FOREIGN PATENT DOCUMENTS 1351454  5/1972  United Kingdom .................. 136/89

Primary Examiner—Aaron Weisstuch
Attorney, Agent, or Firm—J. B. Hinson

[57] ABSTRACT

An integrated array of solar cells, each cell having a positive and a negative electrode, is disclosed. A first grid comprising a plurality of non-intersecting electrically conductive members is affixed to an insulating substrate. Each single individual member of this grid forms the negative electrode of an individual cell of the array. Overlying and affixed to the negative electrodes and the surface of the substrate between these electrodes is a semiconductor layer of a first conductivity type. Isolated (i.e., non-touching or non-abutting) semiconductor regions of a second conductivity type form a plurality of PN junctions with the semiconductor layer. These P-N junctions are the active areas of the individual cells of the array. Each of the isolated semiconductor regions of the second conductivity type is solely coupled to an individual member of another grid whose members form the positive electrodes of the individual cells. Electrical interconnection is made through a non-active region of the semiconductor layer to couple the cells comprising the array in series circuit relationship.

8 Claims, 6 Drawing Figures

INTEGRATED SOLAR CELL ARRAY

BACKGROUND OF INVENTION

1. Field of the Invention

The invention relates to solar energy conversion arrays and more particularly to an integrated array of cadmium sulfide-copper sulfide photovoltaic cells connected in a series circuit relationship.

2. Description of the Prior Art

One example of a prior art array of photovoltaic cells is disclosed in U.S. Pat. No. 4,042,418, issued to William J. Biter on Aug. 16, 1977 and assigned to the same assignee as this application. This patent discloses two embodiments of an integrated array of photovoltaic cells. In the first embodiment, illustrated in FIG. 2 of the Biter patent, the negative electrode of each of the cells of the array is formed on an insulating substrate by depositing thereon a grid of electrically conductive members. The substrate and the grid are then covered by a layer of N conductivity type semiconductor material such as cadmium sulfide. A layer of P conductivity type copper sulfide is formed on the upper surface of the cadmium sulfide by dipping the cadmium sulfide layer in a solution containing cuprous ions or by vapor deposition. A second grid of electrically conducting strips, with each of these strips forming the positive electrode of a cell, is then deposited on the upper layer of the copper sulfide. Current collector grids are affixed to the P conductivity copper sulfide layer in the areas between the positive electrodes. Each of the current collector grids overlaps and is in sole electrical contact with an adjacent positive electrode. The positive electrode of each cell overlies the edge of the negative electrode of an adjacent cell. A low electrical resistance connection between the positive and negative electrodes of adjacent cells of the array is made through the semiconductor layer to couple all of the cells of the array in series circuit relationship.

In a second embodiment, illustrated in FIG. 3 of the Biter patent, portions of the copper sulfide layer are removed to expose regions of cadmium sulfide. A second grid forming the positive electrodes of the array is deposited on the exposed regions of cadmium sulfide. This permits the positive and negative electrodes of adjacent cells to be connected through the thin cadmium sulfide layer alone.

SUMMARY OF THE INVENTION

In the preferred embodiment of the invention the negative electrodes of the cells comprising the array are formed by vapor depositing a pattern of non-intersecting metallic conductors on an insulating substrate. This pattern is in the form of a grid. For convenience, this grid will be referred to as the negative electrode grid.

A continuous layer of N conductivity type semiconductor material is affixed to the negative electrode grid and the portions of the substrate lying between the members of this grid by vapor depositing N conductivity type polycrystalline cadmium sulfide thereon. A second grid of non-intersecting electrically conductive members is then formed on and affixed to the upper surface of the cadmium sulfide layer. The members of this grid serve as the positive electrodes of the individual cells. For convenience this grid will be referred to as the positive electrode grid.

Individual members of the positive electrode grid are parallel to the members of the negative electrode grid. The positive and negative electrodes are positioned such that the positive and negative electrodes of adjacent cells overlap and are spaced apart by the cadmium sulfide layer.

A thin strip of electrically insulating material is affixed, by vapor depositing silicon oxide for example, to the cadmium sulfide layer alongside and contiguous with (i.e., in parallel and abutting relationship to) each member of the positive electrode grid. Portions of the cadmium sulfide layer not covered by the members of the positive electrode grid and the contiguous insulating strips are converted to isolated polycrystalline P conductivity type regions of copper sulfide by successively dipping the entire structure in an HCl etching solution, a CuCl solution, followed by a water rinse to form PN junctions. The PN junctions formed between the cadmium sulfide layer and the isolated regions of copper sulfide from the active junctions comprising the array.

During this process the positive electrodes and the insulating strips act as a mask preventing the underlying portions of the cadmium sulfide layer from being converted to P conductivity polycrystalline copper sulfide type. If either the electrodes are aluminum or are plated with a metal higher in the EMF series than copper, they must be protected by the cadmium sulfide layer or some other masking means during the formation of the copper sulfide regions to prevent the solutions from reacting with electrodes.

Current is collected at the positive side of the PN junction comprising each of the cells and solely coupled, except for surface leakage paths, to the positive electrode of the cell by a pattern of electrically conductive members affixed to the copper sulfide region. Each of these patterns of electrically conductive members is referred to as a current collector grid.

The members of the current collector grids are positioned at approximately 90 degrees with respect to the members of the positive electrode grid. Each member of the positive electrode grid is in low electrical resistance contact with an underlying member of the negative electrode grid through the cadmium sulfide layer. This provides an electrical connection coupling the cells comprising the array in series. The insulating members contiguous with the members of the positive electrode grid reduce electrical shorts between the positive electrodes and the adjacent current collector grid and increase the leakage resistance between the positive electrodes of adjacent cells of the array.

The upper surface of the array is protected from contamination by the atmosphere by a silicon oxide layer. This silicon oxide layer may be formed by vapor deposition.

A second embodiment of the invention which is essentially identical to the one described above except that the insulating strips contiguous with the members of the positive electrode grid are not used is also disclosed. Modifications which permit the array to be constructed as a continuous strip and cut into shorter sections to form modular arrays having any desired output voltage and output terminals at opposite edges of the array are also disclosed.

DESCRIPTION OF PREFERRED EMBODIMENT

Figure 1:
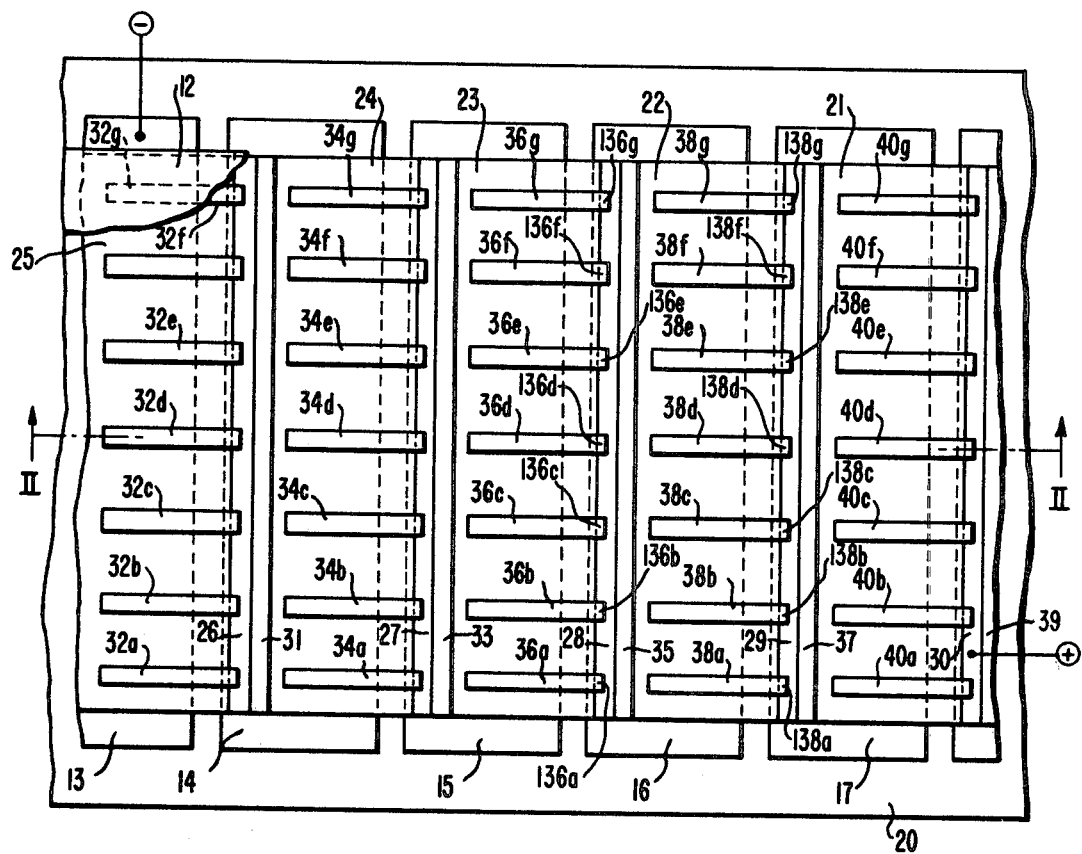
FIG. 1 is a top view of an array comprising the preferred embodiment of the invention.

FIG. 1 is a top view of a five cell segment of an indefinite length array consisting of photovoltaic cells connected in series circuit relationship. Any desired number of cells can be interconnected to form the array depending on the terminal voltage desired. The array illustrated in FIG. 1 comprises the preferred embodiment of the invention.

Figure 2:
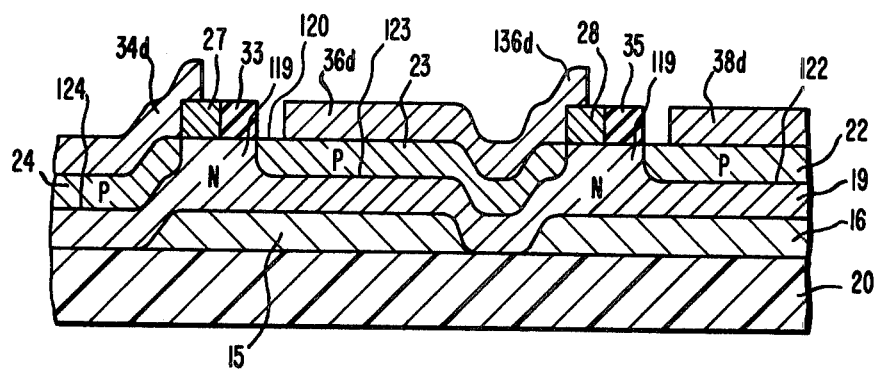
FIG. 2 is a partial cross-section drawing of the array illustrated in top view in FIG. 1.

FIG. 2 is a partial cross-section drawing taken along section line II—II of FIG. 1, illustrating the details of individual cells comprising the preferred embodiment of the array. The details of the preferred embodiment will be described with reference to FIGS. 1 and 2.

The preferred embodiment of the array includes an electrically insulating substrate 20. The electrically insulating substrate 20 is preferably an aromatic polyimide film sold by duPont under the tradename Kapton. Other suitable materials for the substrate 20 include anodized aluminum, polyester film, fluorocarbon films, glass and ceramic. Any substrate may be used provided (1) at least the top surface is electrically insulating; (2) the electrically insulating surface is compatible with the metal used for the negative electrodes of the cells and the N conductivity type polycrystalline semiconductor layer; (3) it will withstand the expected processing temperatures of the range of 250° C.; and (4) does not evolve gases at the processing temperature. Additionally the substrate may be either flexible or rigid. The term "flexible" as used in describing the substrate means a substrate that can be wrapped around a mandrel of the order of 0.0492 cm. in diameter. All other substrates are referred to as rigid.

Immediately overlying and affixed to the insulating substrate 20 is a plurality of non-intersecting electrically conductive members, 13 through 18, with two members, 15 and 16, illustrared in cross-section in FIG. 2. For convenience of discussion these members, 13 through 18, are referred to collectively as the negative electrode grid.

In the preferred embodiment, the negative electrode grid members, 13 through 18, are made of aluminum. The preferred width and distance between adjacent members of the negative electrode grid are, respectively, in the order of 1.0 and 0.01 cm. Negative electrode grid members, 13 through 18, may also be layered with a first layer of aluminum and a second layer of copper.

Overlying and affixed to the electrically insulating substrate 20 and the negative electrode grid is a semiconductor structure consisting of a first region 19 of N conductivity type polycrystalline cadmium sulfide and isolated, P conductivity type regions, 21 through 25, of polycrystalline copper sulfide. (Isolated means that the P conductivity type polycrystalline copper sulfide regions, 21 through 25, are separated from each other by some portion of the N conductivity type polycrystalline cadmium sulfide layer 19.) The N and P conductivity type regions, 19 and 21 through 25, are respectively in the order of 20 and 0.10 microns thick.

Overlying portions 119 of region 19 which extend to upper surface 120 of the semiconductor structure is a second plurality of non-intersecting electrically conductive members, 26 through 30, with two typical members illustrated in cross-section in FIG. 2 at reference numerals 27 and 28. These electrically conductive members are referred to collectively as the positive electrode grid. In the preferred embodiment, the positive electrode grid members, 26 through 30, are made of copper and have a width and thickness respectively in the order of 40 and 1.0 microns. Positive electrode grid members, 26 through 30, may also be made of a layer of aluminum covered by a layer of copper.

A single member of the positive electrode grid overlies and is affixed to each of the portions 119 of the N conductivity type region 19 which extends to the upper surface 120 of the semiconductor structure between adjacent isolated P conductivity regions. For example, a typical member 28 is affixed to portion 119 of N conductivity type region 19 between two adjacent isolated P conductivity type regions, 22 and 23. The remainder of the members, 26, 27, 29 and 30, of the positive electrode grid are similarly affixed to portions 119 of the N conductivity layer 19 between the other P conductivity type regions, 21, 24 and 25.

The members, 26 through 30, of the positive electrode grid are parallel to the members, 15 through 17, of the negative electrode grid. A typical member 28 of the positive electrode grid overlaps the edge of a typical member 16 of the negative electrode grid and is spaced therefrom by N conductivity type layer 19. Alongside and contiguous (i.e., in abutting relationship) with each member of the positive electrode grid is a thin electrically insulating strip. These insulating strips are illustrated at reference numerals 31, 33, 35, 37 and 39 and in the preferred embodiment are deposited silicon oxide having a width in the order of 40 microns. Two typical electrically insulating strips are illustrated in cross-section in FIG. 2 at reference numerals 33 and 35.

Overlying and affixed to each of the P conductivity regions, 21 through 25, is a current collector grid, with each grid comprising a plurality of electrically conductive members respectively illustrated at reference numbers 32a–32g, 34a–34g, 36a–36g, 38a–38g, and 40a through 40g. For example a typical current collector grid consisting of seven members, 36a through 36g, overlies and is affixed to a typical P conductivity type region 23. Members, 36a through 36g, of this grid overlap and electrically contact a typical adjacent member 28 of the positive electrode grid. Similarly, P conductivity type region 24 has affixed thereto a current collector grid consisting of seven members, 34a through 34g. The members of this grid overlap and electrically contact an adjacent member 27 of the positive electrode grid. The other current collector grids are similarly affixed to the other P conductivity type regions, 21, 22 and 25.

In the preferred embodiment, the current collector grids are formed by first vapor depositing a thin layer of gold through a mask to form low ohmic connections to the P conductivity type regions, 21 through 25, followed by vapor depositing a thin layer of copper on the gold to reduce the electrical resistance of the current collector grids. The individual members of the current collector grids have a width and thickness respectively in the order of 25 and 1.0 microns.

Typical PN junctions 122, 123 and 124 between the P conductivity regions 22 through 24 and N conductivity type region 19 form the active junctions of three individual series coupled cells of the array. For example, member 16 of the negative electrode grid forms the negative electrode of a cell consisting of PN junction 122 between the N conductivity type region 19 and P conductivity type region 22. A current collector grid, comprising members 38a through 38g is affixed to P conductivity type region 22. Ends, 138a through 138g, of the members of this current collector grid overlap and make electrical contact with member 29 of the positive electrode grid. The electrical resistance of portion 119 of semiconductor region 19 between negative electrode grid member 16 and positive electrode grid member 28 is quite low, i.e., in the order of 1 ohm per square centimeter. Thus there is a low electrical resistance between member 28 of the positive electrode grid and member 16 of the negative electrode grid thereby electrically coupling the negative electrode of the cell comprising PN junction 122 to the positive electrode grid member 28.

A second cell of the array comprises PN junction 123 formed by N and P conductivity regions, 19 and 23. A current collector grid consisting of members 36a through 36g is affixed to P conductivity type region 23. The ends 136a through 136g of members 36a through 36g, of this current collector grid overlap and form a low electrical resistance contact to member 28 of the positive electrode grid. Electrical contact is made to PN junction 123 through a negative electrode grid member 15. Thus it can be seen that two adjacent cells comprising PN junctions 122 and 123 are connected in an electrical series circuit relationship. The above-described cell arrangement is repeated to construct an array comprising any desired number of cells with the number of cells determining the output voltage of the array. The area of the individual cells determines the maximum output current of the array. Cells having a width in the order of 30 cm. and a length of 1 to 3 cm. can be conveniently constructed. Such cells have an open circuit voltage in the range of 0.4 to 0.8 volts and a short circuit current in the range of 15 to 30 milliamps per square cm.

In FIG. 1, as an example, five series connected cells are illustrated with a member 13 of the negative electrode grid serving as the negative terminal of the array and a member 30 of the positive electrode grid serving as the positive terminal of the array.

The entire upper surface of the array is protected by a thin transparent electrical insulating layer 12 of vapor deposited silicon oxide. The thin insulating protective layer 12 renders the active areas of the cells impervious to moisture with the substrate providing protection for the bottom surface and insulating layer 12 providing protection for the upper surface.

Figure 3:
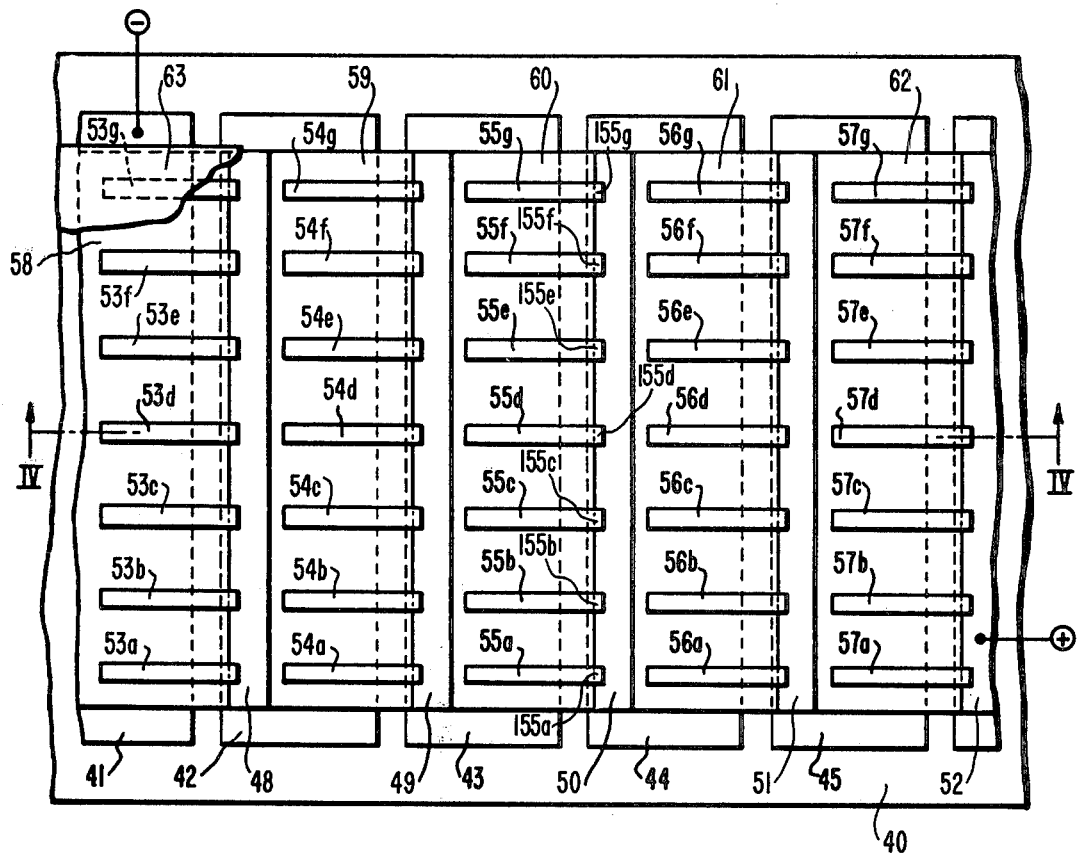
FIG. 3 is a top view of a second embodiment of the invention.

FIG. 3 is a top view of five cells of an array which comprises a second embodiment of the invention. A portion of this embodiment is shown in cross section along line IV—IV in FIG. 4 to illustrate the details of the cells.

The photovoltaic cells comprising the array are constructed on a flexible substrate 40. The substrate 40 may also be an aromatic polyimide film such as Kapton or any of the other substrates previously discussed with reference to FIG. 1. Immediately overlying the substrate 40 is a plurality of non-intersecting electrical conductors, 41 through 45, which comprise the negative electrodes of the cells of the array. As in the previous embodiment, these conductors will be referred to collectively as the negative electrode grid and may be vapor deposited aluminum.

Figure 4:
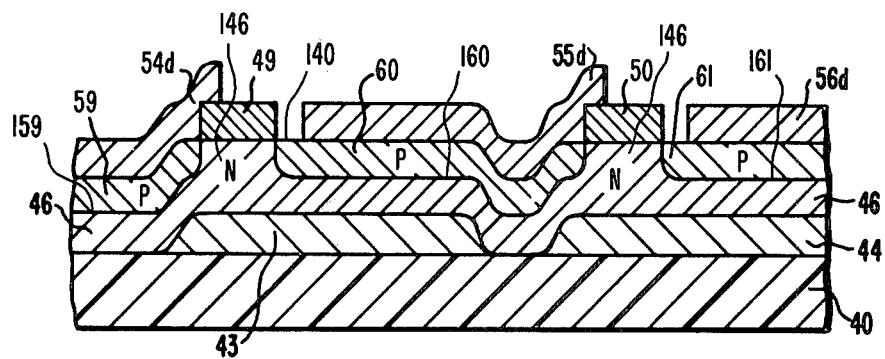
FIG. 4 is a partial cross-section drawing of the array illustrated in top view in FIG. 3.

Immediately overlying and affixed to the substrate 40 and the members of the negative electrode grid, 41 through 45, is a semiconductor structure consisting of an N conductivity type region 46 of cadmium sulfide and isolated P conductivity type regions of copper sulfide, 58 through 62, with three typical P conductivity type regions illustrated in cross-section at reference numerals 59, 60 and 61 of FIG. 4. These regions, 58 through 62, extend to the upper surface 140 of the semiconductor structure. Overlying and affixed to portions 146 of the N conductivity type region 46 which extend to the upper surface 140 of the semiconductor structure between adjacent P conductivity type regions is a plurality of non-intersecting electrically conductive members, 48 through 52. Two typical members are illustrated in cross-section at reference numbers 49 and 50 of FIG. 4. These electrically conductive members are referred to collectively as the positive electrode grid and may be vapor deposited copper.

A single member of the positive electrode grid is affixed to portion 146 of the N conductivity type cadmium sulfide layer 46 between adjacent P conductivity type regions. For example, a typical member 50 of the positive electrode grid is affixed to portion 146 of region 46 between P conductivity regions 60 and 61. Each member of the positive electrode grid serves as the positive electrode of a cell of the array.

A third plurality of electrically conductive members are affixed to each of the P conductivity type copper sulfide regions, 58 through 62, with these members being disposed essentially at right angles with respect to the members, 48 through 52, of the positive electrode grid. For convenience, the members affixed to a single P conductivity region will be referred to as a current collector grid. The members of the five current collector grids are illustrated in FIG. 3 at reference numerals 53a through 53g, 54a through 54g, 55a through 55g, 56a through 56g and 57a through 57g.

A typical current collector grid comprising seven members 55a through 55g overlies and is affixed to a typical P conductivity copper sulfide region 60. The ends 155a through 155g of members 55a through 55g of this grid overlap and make direct electrical contact with a typical adjacent member 50 of the positive electrode grid. Positive electrode grid member 50 is coupled to negative electrode grid member 44 through portion 146 of the N conductivity type cadmium sulfide semiconductor layer 46. This couples two adjacent cells comprising junction 160 and junction 161 in series. The other cells of the array are identical in structure with the number of cells selected to give the desired terminal voltage.

The embodiment illustrated in FIG. 3 is essentially identical to the embodiment illustrated in FIG. 1 except that the insulating members contiguous with the members of the positive electrode grid are not used. As in the previous embodiment, the upper surface of the array may be protected by a thin transparent insulating layer 63, such as silicon oxide.

Figure 5:
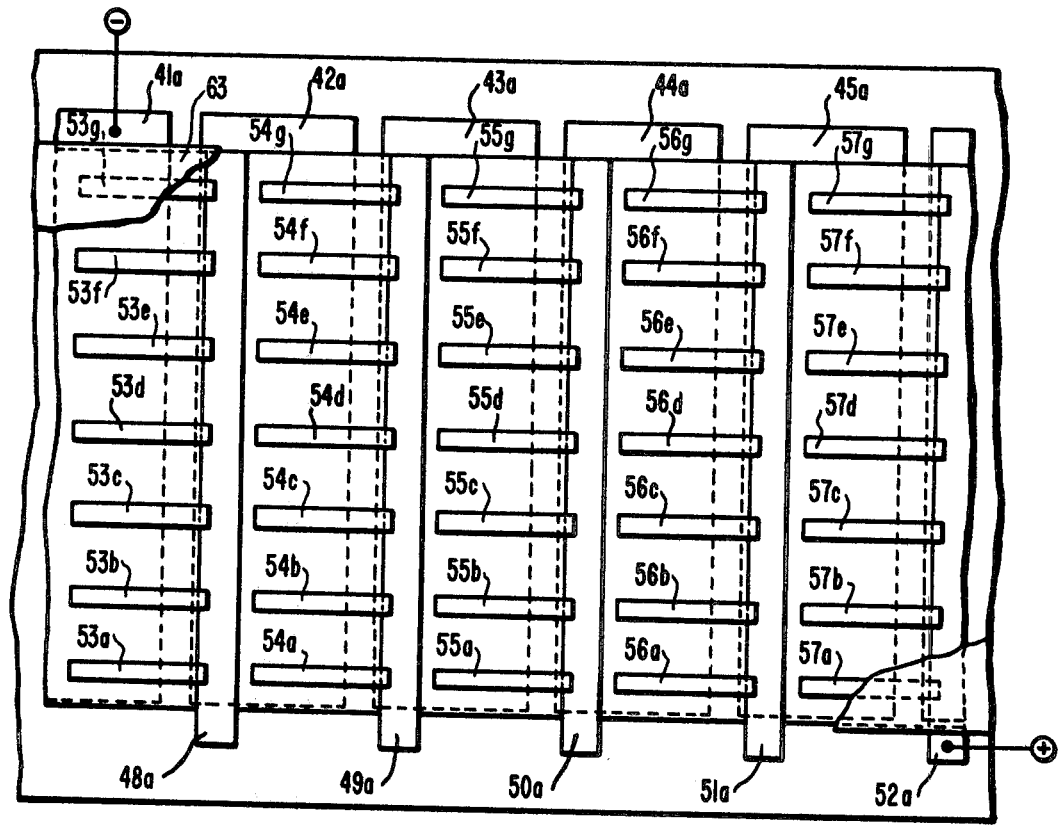
FIG. 5 is a top view illustrating another embodiment of the invention.

FIG. 5 is a third embodiment of the invention. This embodiment is identical with the embodiment illustrated in FIG. 3 except that the members 41a through 45a comprising the negative electrode grid extend beyond the boundary of the semiconductor structure along one edge and the members 48a, 49a, 50a, 51a and 52a comprising the positive electrode grid extend beyond the boundary of the semiconductor structure at the opposite edge of the array. The letter "a" following the reference numerals has been used in FIG. 5 to identify the modified members of the positive and negative electrode grids that were illustrated in FIG. 3. The same reference numerals have been used to identify the members of the current collector grids in FIGS. 3, 4 and 5 to emphasize that these members are identical in both embodiments. The array illustrated in FIG. 5 provides a convenient means of forming electrical connections to the cells of the array. This embodiment permits any member of the positive or negative electrode arrays to be used as an output terminal permitting a large array to be conveniently cut to form smaller arrays.

The cross-section of the active regions of the individual cells of the array illustrated in FIG. 5 may be identical to the cells illustrated in either FIGS. 2 or 4. However, the array illustrated in FIG. 5 uses cells having a cross-section identical to the array illustrated in FIG. 4.

The process for making the array will now be described in detail. The preferred material for the substrate 20 of the array illustrated in FIG. 1 as well as the other embodiments is an aromatic polyimide film sold under the tradename Kapton by duPont. The conductors forming the negative electrodes of the individual cells comprising the array may be aluminum, for example, are vapor deposited onto the Kapton film forming the substrate. Following formation of the negative electrode grid a thin film of N conductivity type polycrystalline cadmium sulfide is affixed by vapor deposition to the members of the negative electrode grid and the substrate. Single crystal semiconductors are also usable. Other usable semiconductors include silicon and gallium arsenide. However, considering the current state of the art, single crystal semiconductors of the desired size are difficult to fabricate.

The grid members forming the positive electrodes of the cells comprising the array are formed on the upper surface of the N conductivity type polycrystalline cadmium sulfide layer. These members are preferably formed by vapor depositing copper onto the semiconductor layer through a mask. Silicon oxide is vapor deposited through a mask to form insulating members 31, 33, 35, 37, and 39 contiguous with the members of the positive electrode grid. The entire structure is dipped in a solution consisting of approximately 50% concentrated HCl and 50% water. This is followed by dipping the entire structure in a concentrated solution of water and copper chloride, followed by a rinse in deionized water. This converts the exposed portions of the N conductivity type cadmium sulfide layer to P conductivity type copper sulfide to form N conductivity type regions 21, 22, 23, 24 and 25. During this process the members of the positive electrode grid members 26, 27, 28, 29 and 30 (FIG. 1) in conjunction with insulating members 31, 33, 35, 37 and 39 (FIG. 1) serve as a mask protecting the underlying portions of the N conductivity type layer 19 (FIG. 1).

Since in the preferred embodiment the members of the negative electrode grid are aluminum and the members of the positive electrode grid are copper it is necessary to provide a protective coating over the negative electrodes. This can be done by completely covering the negative electrodes with the cadmium sulfide layer or by providing a protective coating of evaporated silicon oxide over the exposed portions of the negative electrode.

Following formation of the copper sulfide regions the current collector grids are formed by vapor depositing a thin layer of gold followed by a thin layer of copper through a mask. After formation of the current collector grids a thin protective electrically insulating layer 12 of silicon oxide is deposited on the upper surface of the array.

All of the above process steps can be carried out in a continuous operation permitting integrated arrays of any desired size to be conveniently manufactured utilizing automated processing.

The embodiment illustrated in FIG. 3 is manufactured using essentially the same process as described for the embodiment of FIG. 1 except that the step for forming the insulating members contiguous with the members of the positive electrode grid is deleted. Similarly, the embodiment illustrated in FIG. 5 can be manufactured using the same processes with suitable adjustments being made for the changes in the positive and negative electrode grids.

The arrays described above have many advantages. The cells can be formed on a continuous roll of Kapton as the insulating substrate, for example, and the roll can be cut to any arbitrary size to form arrays of any desired output voltage. Array reliability is improved because all of the interconnections between the cells is made during the manufacture. Area efficiency is also improved because the current collector grids and the positive electrode grids cover a very small portion of the upper suface of the array. Electrical efficiency is improved because leakage between electrodes of adjacent cells is reduced. Construction is simplified because the arrays may be constructed using proved prior art processes and automated equipment.

Figure 6:
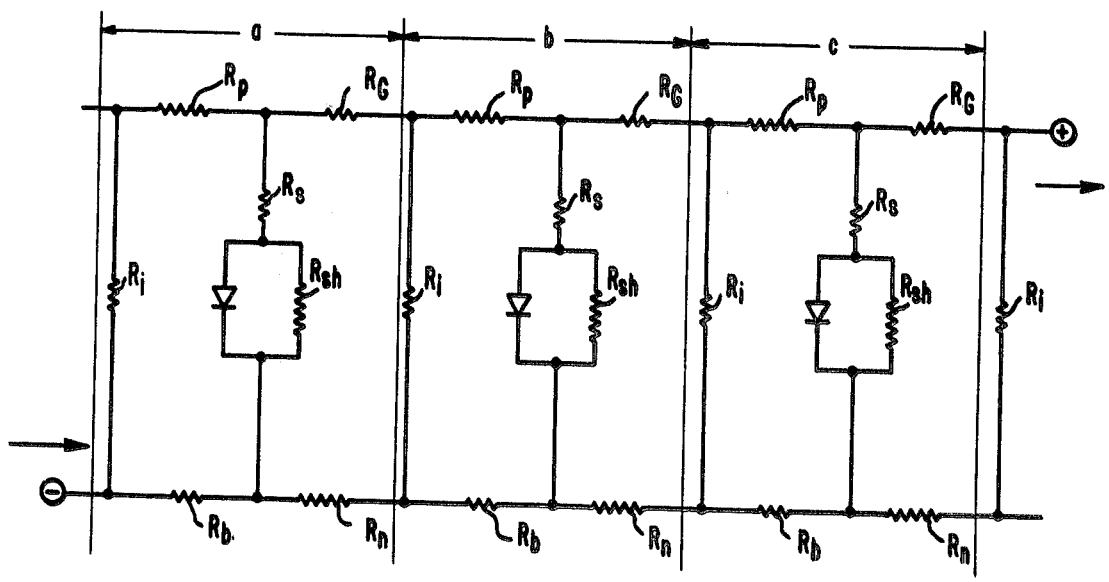
FIG. 6 is a schematic diagram of the equivalent electrical circuit of the array.

FIG. 6 is a schematic diagram the equivalent electrical circuit of an array utilizing three cells with each cell comprising a single P-N junction. Three identical cells are labeled a, b and c, are illustrated. However, it should be emphasized that any convenient number of cells can be utilized. The terminal voltage of the array is determined by the number of cells and the current is determined by the area of the individual cells.

In the illustrated equivalent circuit the various electrical losses in the array are represented by lumped resistances. The various resistance elements of the equivalent circuit are defined as follows:

$R_b$ = resistance attributable to the negative electrode grid.

$R_g$ = resistance attributable to the current collector grid.

$R_i$ = the resistance between the positive electrode of one cell and the negative electrode of the adjacent cell.

$R_n$ = the resistance of the leakage path between the negative electrodes of adjacent cells through the cadmium sulfide layer.

$R_p$ = the resistance of the leakage path between adjacent P conductivity type regions forming the cells through the cadmium sulfide layer.

$R_s$ = internal series resistance of the individual cells.

$R_{sh}$ = internal shunt resistance of the individual cells.

The various resistance elements result in resistance losses in the cells. These resistance losses are related to the structure of the array, as described in detail below.

The resistance of the negative electrode grid ($R_b$) is determined primarily by the resistivity of the metal used to form the negative electrodes of the cells and the dimensions of the electrodes. The negative electrodes of the cells may be aluminum having a thickness of one micron and a width of one to two centimeters. Adjacent electrodes may be separated from each other by approximately one millimeter.

The resistance of the current collector grid ($R_g$) is determined primarily by the lengthwise resistance of individual elements of the current collector grid and the number of such individual elements. A current collector grid is typically constructed of a low electrical resistance metal such as gold or copper. Each element of the collector grid is typically about 0.0025 cm wide, 0.0001 cm thick, 2.5 to 5.0 cm long and spaced about 40 elements per centimeter. The resistance attributable to the current collector grid can be reduced by selecting the metal for the grid as well as the cross-sectional area of the member of the grid. It is desirable that this resistance be made as low as possible because all of the load current supplied by the array must flow through this resistance resulting in power loss. However, it should be noted that the width of the elements of the grid should be kept as small as practical because any area covered by the members of this grid is ineffective as far as converting radiation to electrical power is concerned.

The resistance between the positive electrode of one cell and the negative electrode of the adjacent cell has been designated ($R_i$). As illustrated in FIG. 2, a typical positive electrode 27, for example, is coupled to the negative electrode 15 of the adjacent cell through the semiconductor layer 19. As previously discussed, this is also the path by which current flows through the array. A typical positive electrode 27 and a typical negative electrode 15 are each made of metal which has relatively low resistance as compared to the semiconductor layer 19. Therefore, the value of ($R_i$) is determined primarily by the thickness and resistivity of the semiconductor layer 19 and is relatively low (in the order of one ohm per square centimeter) because the semiconducting layer is thin, i.e., in the order of 30 microns.

The electrical resistance ($R_n$) of the leakage path between adjacent negative electrodes of the array, for example between the members illustrated at reference numerals 15 and 16, is determined primarily by the resistivity of the semiconductor layer 19, its thickness, and the separation of adjacent negative electrodes. This resistance is relatively high (i.e., in the order of 100 to 1000 ohms per square centimeter), resulting in relatively low electrical leakage between adjacent cells on the negative side of the junction. This is because the thickness of the semiconductor layer is much less than the distance between adjacent negative electrodes.

The array includes regions 21, 22, 23, 24 and 25 (FIG. 1) of P-type conductivity semiconductor material. These regions form the active P-N junctions with the N-type semiconductor layer (19 in FIG. 2). Each active cell of the array comprises a portion of the N conductivity layer 19 and one of the P conductivity regions 21, 22, 23, 24 and 25. Two typical P conductivity regions associated with adjacent cells of the array are illustrated ar reference numerals 22 and 23 (FIG. 2). These P conductivity type regions 22 and 23 are separated by a portion of the N conductivity type semiconductor layer 19. Since the cells of the array are connected in series, an electrical potential will be developed between the P conductivity regions associated with adjacent cells. This potential results in a leakage current flowing between adjacent P conductivity regions. This loss is represented by ($R_p$). This resistance is also in the range of 100 to 1000 ohms per square centimeter.

Photovoltaic devices have an internal resistance associated with the device. This resistance is determined by the characteristics of the semiconductor materials used to build the cells and can be separated into series and shunt components. These losses are represented by $R_s$ and $R_{sh}$. These losses are determined by the type and quality of the semiconductor materials used.

The integrated arrays described above are quite flexible, permitting arrays to be designed to optimize particular characteristics. For example, the positive and negative electrodes in the preferred embodiment discussed above are preferably copper and aluminum, respectively. This construction results in a high reliability medium performance array. Electrical efficiency can be improved by making the electrodes of composite layers of metal. A first metal, such as aluminum, indium or zinc can be used as a thin layer to form a low resistance contact with the N-type conductivity semiconductor material. The resistance of the electrodes is further reduced by a second layer of low resistance metal, such as copper, gold or silver under (i.e., between the first metal and the substrate) the aluminum.

Similarly, for the current collector grid members, a first metal such as gold can be used as a thin layer to form a low resistance contact with the P-type conductivity semiconductor material. The resistance of the grid members is further reduced by a second layer of low resistance, lower cost metal such as copper over the gold.

Additionally, the members of the current collector grid can be tapered to increase the cross-section area as the current increases beginning at the open ends of the current collector array and reaching a maximum width at the positive electrodes. Losses in the collector grid can also be decreased by making the individual cells short relative to their width. This also permits the members of the current collector grid to be thin and narrow without exceeding the current carrying capability of the grid. Grids having thin and narrow members may be formed by vapor deposition. Vapor deposition is an advantageous process for forming the current collector grids because it is easily automated.

We claim:

1. A method for making an array of series coupled photovoltaic cells comprising the steps of:
 (a) forming a first array comprising a first plurality of parallel isolated electrically conductive members on an electrically insulating surface, each of said individual members serving as a first electrode of a single cell of said array;
 (b) forming a layer of semiconductor material of a first conductivity type overlying and affixed to said substrate and to said electrically conductive members;
 (c) forming a second array comprising a second plurality of parallel isolated electrically conductive members affixed to the top surface of said semiconductor layer, each individual member comprising said second array serving as a second electrode of a cell of said array and solely overlapping an edge of a single individual member of said first array but spaced therefrom and electrically coupled thereto by said semiconductor layer;
 (d) forming a plurality of isolated regions of semiconductor material of a second conductivity type each having an interface with said semiconductor layer with the PN junctions formed at said interface comprising the active junctions of said array of photovoltaic cells;

(e) forming a plurality of current collector grids each comprising a plurality of electrically conductive members, each region of said plurality of isolated regions of semiconductor material of a second conductivity type having a current collector grid formed thereon and electrically connected to an adjacent member of said second electrode array.

2. A method for making an array of series coupled photovoltaic cells comprising the steps of:

(a) forming a first array comprising a first plurality of isolated electrically conductive members on an insulating substrate, each of said plurality of members serving as a first electrode of a single cell of said array;

(b) forming a layer of semiconductor material of a first conductivity type overlying and affixed to said substrate and to said first plurality of electrically conductive members such that a top surface of said layer of semiconductor material is exposed;

(c) forming a second array comprising a second plurality of isolated electrically conductive members affixed to portions of said top surface of said semiconductor layer, each of said members comprising said second array solely overlying an edge of a member of said first grid by spaced therefrom and electrically coupled thereto by said semiconductor layer;

(d) forming a plurality of strips of electrically insulating material, each of said strips being affixed to another portion of said top surface of said semiconductor layer in parallel and abutting relationship to a member of said plurality of isolated electrically conductive members comprising said second array, leaving portions of said top surface of said semicondcutor layer exposed;

(e) forming a plurality of regions of semiconductor material of a second conductivity type each having an interface with said exposed top surface portions of said semiconductor layer with the PN junctions formed along said interface comprising the active junctions of said array;

(f) forming a plurality of current collector grids, each of said current collector grids comprising a plurality of electrically conductive members, said plurality of electrically conductive members comprising each current collector grid solely overlapping and affixed in electrically conductive relationship with a sole member of said second array and to a sole member of said plurality of regions of semiconductor material of a second conductivity type.

3. The method for making an array of photovoltaic cells in accordance with claim 2 wherein said layer of semiconductor material is polycrystalline cadmium sulfide formed by vapor deposition.

4. The method for making an array of photovoltaic cells in accordance with claim 3 wherein said plurality of regions of semiconductor material of second conductivity type comprise polycrystalline copper sulfide is formed by successively subjecting said exposed top surface portions of said layer of cadmium sulfide to:

(a) a concentrated solution of HCl and water;
(b) a saturated solution of copper chloride and water; and
(c) rinsing the surface with water.

5. The method of making an array of photovoltaic cells in accordance with claim 2 wherein said electrically insulating substrate is an aromatic polyimide film and wherein said first plurality of isolated electrically conductive members are formed on said aromatic polyimide film by evaporating aluminum through a mask onto said aromatic polyimide film.

6. The method of making an array of photovoltaic cells in accordance with claim 5 wherein said semiconductor layer is formed by vapor depositing cadmum sulfide.

7. The method of making an array of photovoltaic cells in accordance with claim 6 wherein said second array is formed by vapor depositing copper through a mask.

8. The method of making an array of photovoltaic cells in accordance with claim 7 wherein said current collector grids are formed by successively vapor depositing gold and copper through a mask.

* * * * *